(12) United States Patent
Hayashida et al.

(10) Patent No.: US 6,719,842 B2
(45) Date of Patent: *Apr. 13, 2004

(54) AMMONIA FOR USE IN MANUFACTURE OF GAN-TYPE COMPOUND SEMICONDUCTOR AND METHOD FOR MANUFACTURING GAN-TYPE COMPOUND SEMICONDUCTOR

(75) Inventors: Hideki Hayashida, Tokyo (JP); Taizo Ito, Kanagawa (JP); Yasuyuki Sakaguchi, Saitama (JP)

(73) Assignee: Showa Denko Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/473,708

(22) Filed: Dec. 29, 1999

(65) Prior Publication Data

US 2003/0033973 A1 Feb. 20, 2003

Related U.S. Application Data

(60) Provisional application No. 60/114,376, filed on Dec. 30, 1998.

(51) Int. Cl.$^7$ ................................................ C30B 25/02
(52) U.S. Cl. .................... 117/104; 117/89; 117/952; 423/219; 423/235; 423/252
(58) Field of Search ................ 423/219, 235, 423/352; 117/104, 952, 89

(56) References Cited

U.S. PATENT DOCUMENTS

| 3,931,631 A | * | 1/1976 | Groves et al. ................ 357/63 |
| 4,001,056 A | * | 1/1977 | Groves et al. ................ 117/89 |
| 5,716,588 A | * | 2/1998 | Vergani et al. ............. 422/177 |
| 5,831,277 A | * | 11/1998 | Razeghi ...................... 257/15 |
| 5,834,331 A | * | 11/1998 | Razeghi ...................... 438/40 |

FOREIGN PATENT DOCUMENTS

| EP | 0 662 339 A2 | 1/1995 | .......... B01D/53/86 |
| JP | 08-201370 | 8/1996 | .......... G01N/31/12 |
| JP | 09-142833 | 6/1997 | .............. C01C/1/02 |
| JP | 09-251957 | 9/1997 | |

OTHER PUBLICATIONS

Hiebuhr et al, "Electrical and Optical Properties of Oxygen Doped GaN Grown byMOCVD using N2O", Journal of Electronic Materials, vol 26, No. 10, Oct. 1997.*

Patent Abstract of Japan, JP 09-251957, dated Sep. 22, 1997.

* cited by examiner

Primary Examiner—Robert Kunemund
(74) Attorney, Agent, or Firm—Sughrue Mion, PLLC

(57) ABSTRACT

Ammonia for use in the manufacture of a GaN-type compound semiconductor, filled in a charging container 18 such that at least a part of the ammonia is liquid and the liquid phase ammonia has a water concentration determined by a Fourier-transform infrared spectroscopy (FT-IR) of 0.5 vol ppm or less, is introduced in the gaseous state into a reaction chamber 11 housing therein a substrate 1, and a layer comprising a GaN-type compound started from this ammonia is formed on the substrate 1.

3 Claims, 2 Drawing Sheets

AMMONIA FOR USE IN MANUFACTURE OF GaN-TYPE COMPOUND SEMICONDUCTOR AND METHOD FOR MANUFACTURING GaN-TYPE COMPOUND SEMICONDUCTOR

CROSS REFERENCE TO RELATED APPLICATIONS

This application is an application filed under 35 U.S.C. §111(a) claiming benefit pursuant to 35 U.S.C. §119(e)(i) of the filing date of Provisional Application No. 60/114,376 filed Dec. 30, 1998 pursuant to 35 U.S.C. §111(b).

FIELD OF THE INVENTION

The present invention relates to ammonia for use in the manufacture of a GaN-type compound semiconductor and a method for producing a GaN-type compound semiconductor using the ammonia.

BACKGROUND OF THE INVENTION

FIG. 3 shows an example of conventional GaN-type compound semiconductor devices. The GaN-type compound semiconductor device shown here has a constitution such that a buffer layer 2 comprising $Ga_xAl_{1-x}N$ (wherein $0 \leq x \leq 1$) which is a GaN-type compound, a Si-doped n-type $Ga_xAl_{1-x}N$ layer (n-type clad layer) 3 which is an n-type clad layer doped with Si, a Zn-doped $Ga_xAl_{1-x}N$ layer (active layer) 4 which is a light emitting active layer doped with Zn, and a Mg-doped p-type $Ga_xAl_{1-x}N$ layer (p-type clad layer) 5 which is a p-type clad layer doped with Mg are laminated in sequence on a sapphire substrate 1 and electrodes 6 and 7 are provided on the n-type clad layer 3 and p-type clad layer 5, respectively.

This GaN-type compound semiconductor device can be used as a blue light emitting diode.

FIGS. 1 and 2 show an example of a production apparatus for use in the manufacture of the above-described GaN-type compound semiconductor device.

The production apparatus shown here is a metal-organic chemical vapor deposition (MOCVD) reactor and comprises a reaction chamber 11 for housing a sapphire substrate, a support part 12 for holding the sapphire substrate in the reaction chamber 11, a heater 13 for heating the sapphire substrate supported by the support part 12, organic metal containers 14 and 15 as supply sources of organic metals, organic metal gas inlet tubes 16 and 17 for introducing organic metal gases supplied from the containers 14 and 15 into the reaction chamber 11, an ammonia charging container 18 as a supply source of ammonia gas, an ammonia gas inlet tube 19 for introducing the ammonia gas supplied from the charging container 18 into the reaction chamber 11, an outlet tube 20 for discharging gases out of the reaction chamber 11, a Si compound container 23, a Zn compound container 24, a Mg compound container 25, and inlet tubes 26, 27 and 28 for introducing the compounds supplied from the containers 23, 24 and 25 into the reaction chamber 11.

The epitaxial wafer for use in the manufacture of the GaN-type compound semiconductor device is manufactured using the above-described production apparatus according to the MOCVD process as described below.

In the production of the GaN-type compound semiconductor device, a sapphire substrate 1 is housed in a reactor 11, an organic gallium compound housed in a container 14 and an organic aluminum compound housed in a container 15 are bubbled with $H_2$ gas using tubes 21 and 22, the organic gallium compound gas and organic aluminum compound gas obtained are introduced together with $H_2$ gas into the reaction chamber 11 through inlet tubes 16 and 17, at the same time, ammonia gas supplied from a charging container 18 is introduced into the reaction chamber 11 through an inlet tube 19, and then a buffer layer 2 comprising $Ga_xAl_{1-x}N$ is formed on the surface of the sapphire substrate 1 using these organic gallium compound gas, organic aluminum gas and ammonia compound gas as raw materials.

Subsequently, a Si compound supplied from a container 23 is fed into the reaction chamber 11 through a tube 26 together with the above-described organic gallium compound, organic aluminum compound and ammonia gas to form an n-type clad layer 3 on the buffer layer 2.

Then, a Zn compound supplied from a container 24 is fed into the reaction chamber 11 through a tube 27 together with the above-described organic gallium compound, organic aluminum compound and ammonia gas to form an active layer 4 on the n-type clad layer 3.

Thereafter, a Mg compound supplied from a container 25 is fed into the reaction chamber 11 through a tube 28 together with the above-described organic gallium compound, organic aluminum compound and ammonia gas to form a p-type clad layer 5 on the active layer 4.

The thus-manufactured epitaxial wafer is removed from the reaction chamber 11 and electrodes 6 and 7 are provided on the n-type and p-type clad layers 3 and 5, respectively, thereby obtaining a GaN-type compound semiconductor device.

The above-described conventional technique is, however, disadvantageous in that the GaN-type compound semiconductor device obtained tends not to satisfy the light emitting property, particularly brightness. Accordingly, a technique capable of producing a GaN-type compound semiconductor device having excellent light emitting property without failure has been demanded.

SUMMARY OF THE INVENTION

The present invention has been made under these circumstances, and an object of the present invention is to provide a method for manufacturing a GaN-type compound semiconductor, where a GaN-type compound semiconductor having excellent light emitting property can be manufactured without fail.

The present inventors have found that the water concentration in the ammonia gas used as a raw material in the manufacture of GaN-type compound semiconductors has a great effect on the light emitting property such as brightness of the GaN-type compound semiconductor. The present invention has been accomplished based on this finding.

More specifically, the ammonia for use in the manufacture of a GaN-type compound semiconductor of the present invention is filled in a charging container such that at least a part of the ammonia is liquid, and the liquid phase ammonia has a water concentration determined by a Fourier-transform infrared spectroscopy (FT-IR) of 0.5 vol ppm or less.

Furthermore, the method for producing a GaN-type compound semiconductor of the present invention comprises introducing the above-described ammonia in the gaseous state into a reaction chamber housing therein a substrate, and forming a layer comprising a GaN-type compound using the ammonia on the substrate.

DESCRIPTION OF THE PREFERRED EMBODIMENTS

Figure 1:
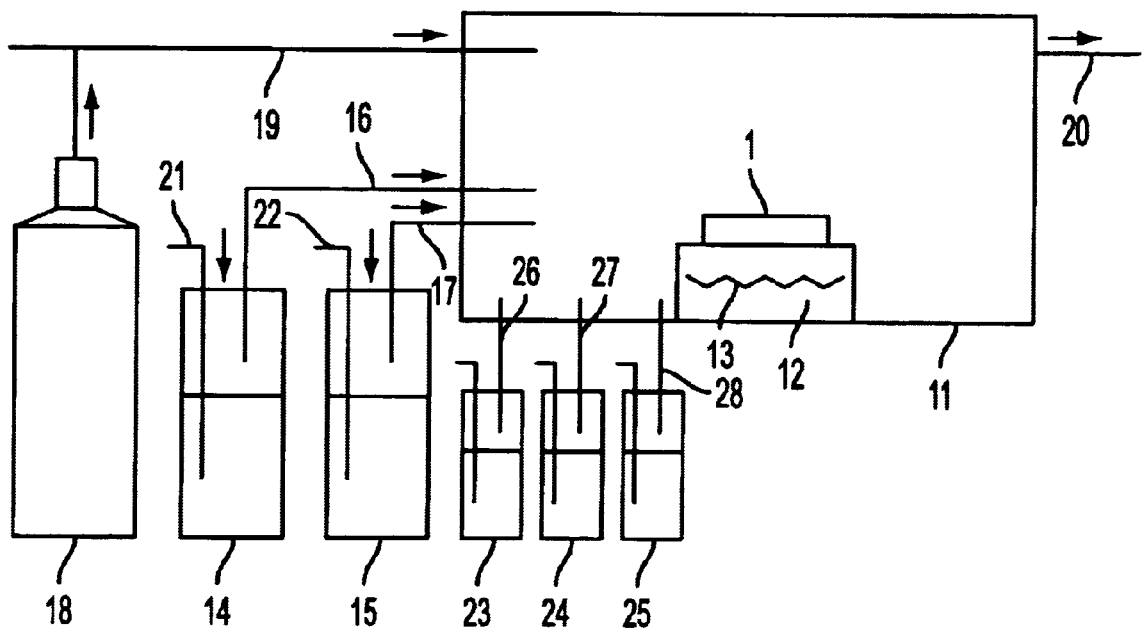
FIG. 1 is a schematic constitutional view showing a production apparatus suitably used for implementing one embodiment of the method for manufacturing a GaN-type compound semiconductor according to the present invention.
Figure 2:
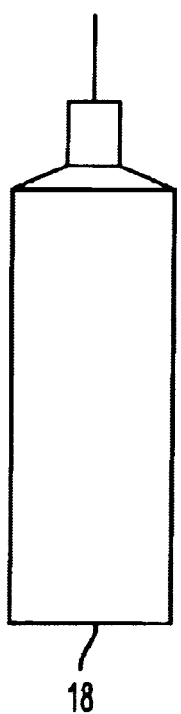
FIG. 2 is a schematic constitutional view showing an ammonia charging container for use in the production apparatus of FIG. 1.
Figure 3:
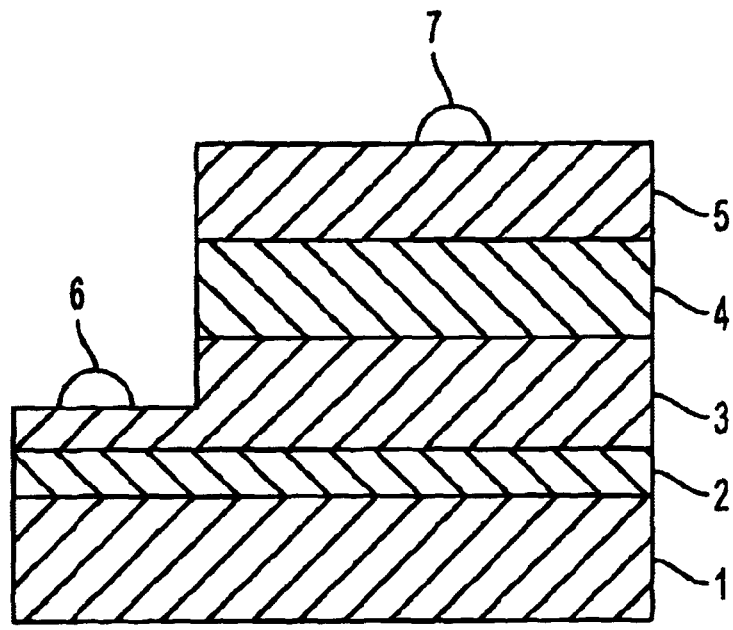
FIG. 3 is a partial cross section showing an example of a GaN-type compound semiconductor device.

One practical embodiment of the method for producing a GaN-type compound semiconductor according to the present invention is described below by referring to the case where a production apparatus shown in FIGS. 1 and 2 is used and a GaN-type compound semiconductor device shown in FIG. 3 is manufactured.

In the production apparatus for use in the manufacturing method of this embodiment, the ammonia in the charging container 18 filled such that at least a part of the ammonia is liquid and the liquid phase ammonia has a water concentration determined by a Fourier-transform infrared spectroscopy (FT-IR) of 0.5 vol ppm or less.

The liquid phase ammonia preferably has a water concentration of 0.4 vol ppm or less, more preferably 0.2 vol ppm or less.

If the water concentration exceeds 0.5 vol ppm, the GaN-type compound semiconductor using the above-described ammonia tends to have reduced light emitting properties such as brightness.

The charging container 18 may be, for example, a cylindrical charging container shown in FIGS. 1 and 2. The inner surface of the charging container is preferably subjected to a plating or a polishing treatment. The material of the charging container 18 may be manganese steel or aluminum alloy.

In the above-described ammonia, the concentration of residual impurities other than water is preferably 1 vol ppm or less.

The above-described ammonia for the manufacture of a GaN-type compound semiconductor can be produced, for example, by a method where crude ammonia is contacted with an adsorbent such as synthetic zeolite or zirconium oxide to adsorb water in the crude ammonia to the adsorbent or is superfractionated and the ammonia after the adsorption or distillation treatment is filled in the charging container 18.

At this time, it is preferred to prevent mixing of water to the utmost in respective processes after the adsorption or distillation treatment until the ammonia is filled in the charging container 18 and previously clean the charging container with purified ammonia or evacuate the charging container.

In the manufacturing method of this embodiment, the GaN-type compound semiconductor is produced using the above-described ammonia for the manufacture of a GaN-type compound semiconductor as follows.

A sapphire substrate 1 is housed in a reaction chamber 11 and supported by a support part 12, the reaction chamber 11 is evacuated, and then the sapphire substrate 1 is heated using a heater 13 preferably at about 400° C.

Subsequently, an organic gallium compound such as trimethyl gallium (TMGa) housed in a container 14 and an organic aluminum compound such as trimethyl aluminum (TMAl) housed in a container 15 are bubbled with $H_2$ gas using tubes 21 and 22, and the organic gallium compound gas and organic aluminum compound gas obtained are introduced together with $H_2$ gas into the reaction chamber 11 through inlet tubes 16 and 17.

At the same time, ammonia gas supplied from a charging container 18 is introduced into the reaction chamber 11 through an inlet tube 19 to form a buffer layer 2 comprising $Ga_xAl_{1-x}N$ obtained from the organic gallium compound gas, organic aluminum compound gas and ammonia gas, on the surface of the sapphire substrate 1.

Then, the temperature of the substrate 1 is elevated to about 1,150° C. and a Si compound such as a silane supplied from a container 23 is fed together with the organic gallium gas, organic aluminum gas and ammonia gas into the reaction chamber 11 through a tube 26 to form a n-type clad layer 3 on the buffer layer 2.

Thereafter, a Zn compound such as dimethylzinc supplied from a container 24 is fed together with the organic gallium compound, organic aluminum compound and ammonia gas into the chamber 11 through a tube 27 to form an active layer 4 on the n-clad layer 3.

Furthermore, a Mg compound such as biscyclopentadienyl magnesium supplied from a container 25 is fed together with the organic gallium compound gas, organic aluminum compound gas and ammonia gas into the reaction chamber 11 through a tube 28 to form a p-type clad layer 5 on the active layer 4.

Subsequently, the thus-manufactured epitaxial wafer is removed from the reaction chamber 11 and electrodes 6 and 7 are provided on the above-described n-type and p-type clad layers 3 and 5, respectively, to obtain the above-described GaN-type compound semiconductor device.

According to the manufacturing method of this embodiment, the GaN-type compound semiconductor device obtained exhibits excellent light emitting property such as brightness. As a result, the production yield can be improved.

While not desiring to be bound, the reason why the GaN-type compound semiconductor device obtained by this manufacturing method exhibits excellent light emitting property is considered as follows. By setting the water concentration in the above-described ammonia to fall within the above-described range, the amount of oxygen mixed into the n-type and p-type clad layers 3 and 5 and the active layer 4, which are formed using the ammonia as a starting material, can be reduced and the layers each comprising such a GaN-type compound semiconductor can be prevented from crystallinity deterioration.

In the embodiment described above, a method of forming n-type and p-type clad layers 3 and 5 and an active layer 4 each mainly comprising $Ga_xAl_{1-x}N$ started from the above-described ammonia is described. However, the present invention is not limited thereto and the above-described ammonia may be used for the manufacture of a GaN-type compound semiconductor where layers comprising a GaN-type compound such as GaN, InGaN, InGaAlN or AlGaN, are formed on a substrate.

EXAMPLES

The present invention is described in greater detail below by specifically referring to the Examples. Unless otherwise indicated, all parts, percents, ratios and the like are by weight.

Test Example 1

Figure 4:
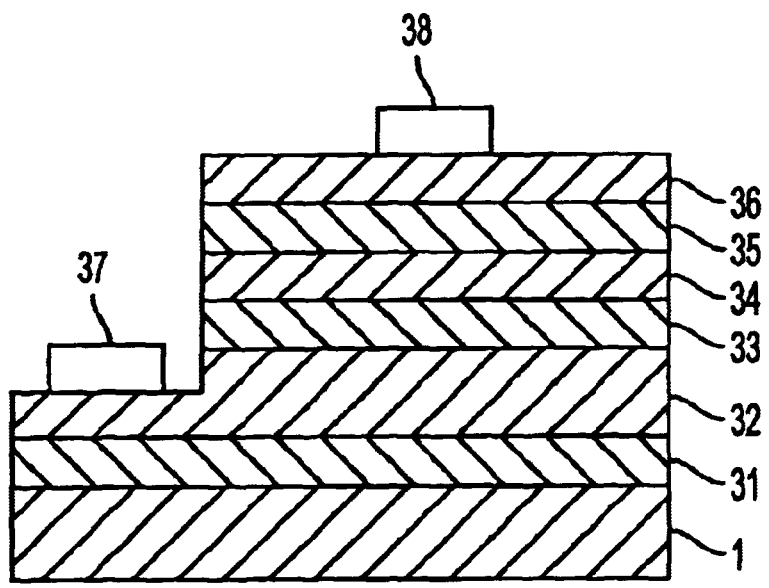
FIG. 4 is a partial cross section showing an example of a GaN-type compound semiconductor device manufactured by one embodiment of the method for manufacturing a GaN-type compound semiconductor according to the present invention.

A GaN-type compound semiconductor device shown in FIG. 4 was manufactured as follows.

The ammonia charging container used here had a volume of 10 l and was filled with 5 kg of liquefied ammonia. The charging container was used by placing it in a room temperature (24° C.) condition.

A circular sapphire substrate 1 having a diameter of 50 mm and a thickness of 0.3 mm was used after the surface thereof was specularly polished.

A single crystalline sapphire substrate 1 having a c face as the main plane was subjected to organic cleaning and supported on a support part in a reaction chamber. Then, the pressure in the reaction chamber was reduced to $1\times10^{-3}$ torr or less, $H_2$ was introduced into the reaction chamber to return the pressure in the reaction chamber to the atmospheric pressure (760 torr), and the substrate temperature was raised to 1,150° C. while introducing $H_2$ into the reaction chamber at 5 slm (standard l/min.), thereby thermal-cleaning the sapphire substrate 1.

After lowering the substrate temperature to 450° C., a carrier gas comprising $H_2$ and $N_2$, ammonia gas and $H_2$ containing trimethyl aluminum (TMAl) vapor were fed into the reaction chamber at 6 slm, 1 slm and 20 sccm (standard cc/min.), respectively, over a 1.5 minute period. At this time, the amount in mol of TMAl supplied was $3.8\times10^{-5}$ mol/min.

During this process, a buffer layer 31 having a thickness of about 20 nm and comprising AlN was formed on the sapphire substrate 1.

Thereafter, the supply of TMAl was stopped, the temperature of the sapphire substrate 1 was raised to 1,100° C., and while keeping this temperature, the above-described carrier gas, ammonia gas, disilane ($Si_2H_6$) diluted with $H_2$ to 1 vol ppm, and $H_2$ containing trimethyl gallium (TMGa) vapor were fed into the reaction chamber at 6 slm, 2.5 slm, 5 sccm and 15 sccm, respectively, over a 90 minute period. At this time, the amount in mol of TMGa supplied was $5.8\times10^{-5}$ mol/min.

During this process, a n-type GaN layer 32 having a thickness of about 1.5 μm and a carrier concentration of about $3\times10^{17}/cm^3$ was formed.

Subsequently, the supply of TMGa was stopped, the temperature of the sapphire substrate 1 was lowered to 850° C., and while maintaining this temperature, the carrier gas, ammonia gas, diethylzinc (DEZn) diluted with hydrogen to 100 vol ppm, $Si_2H_6$ diluted with $H_2$ to 1 vol ppm, $H_2$ containing TMGa vapor, and $H_2$ containing trimethylindium (TMIn) vapor were fed into the reaction chamber at 6 slm, 2.5 μm, 10 sccm, 10 sccm, 5 sccm and 13 sccm, respectively, over a 15 minute period. At this time, the amounts in mol of TMGa and TMIn supplied were $1.9\times10^{-5}$ mol/min and $7.6\times10^{-5}$ mol/min, respectively.

During this process, an InGaN active layer 33 having a thickness of about 100 nm and containing Si and Zn impurities was formed.

Then, while keeping the sapphire substrate 1 at the same temperature as in the formation of the InGaN active layer, the supply of TMIn was stopped and the carrier gas, ammonia gas and $H_2$ containing TMGa vapor were fed into the reaction chamber at 6 slm, 4.5 slm and 1 sccm, respectively, over a 2 minute period. At this time, the amount in mol of TMGa supplied was $3.8\times10^{-6}$ mol/min.

During this process, a GaN layer 34 having a thickness of about 3 nm was formed.

Subsequently, the supply of TMGa was stopped, the temperature of the sapphire substrate 1 was raised to 1,150° C., and while keeping this temperature, the carrier gas, ammonia gas, $H_2$ containing TMAl vapor, $H_2$ containing TMGa vapor, and $H_2$ containing biscyclopentadienylmagnesium (Cp2Mg) vapor were fed into the reaction chamber at 6 slm, 3 slm, 4.3 sccm, 5 sccm and 135 sccm, respectively, over a 10 minute period. At this time, the amounts in mol of TMAl, TMGa and Cp2Mg supplied were $2.3\times10^{-6}$ mol/min, $1.5\times10^{-5}$ mol/min and $1.1\times10^{-4}$ mol/min, respectively.

During this process, a p-type AlGaN layer 35 having a thickness of about 70 nm and a carrier concentration of $1\times10^{17}/cm^3$ was formed.

Thereafter, the supply of TMAl, TMGa and Cp2Mg was stopped, the temperature of the sapphire substrate 1 was lowered to 1,100° C., and while maintaining this temperature, the carrier gas, ammonia gas, $H_2$ containing TMGa vapor, and $H_2$ containing Cp2Mg vapor were fed into the reaction chamber at 6 slm, 2.5 slm, 15 sccm and 135 sccm, respectively, over a 10 minute period.

At this time, the amounts in mol of TMGa and Cp2Mg were $5.7\times10^{-5}$ mol/min and $1.1\times10^{-4}$ mol/min, respectively.

During this process, a p-type GaN layer 36 having a thickness of about 300 nm and a carrier concentration of $3\times10^{17}/cm^3$ was formed.

The thus-obtained epitaxial wafer was removed from the reaction chamber and then, n-electrode 37 and p-electrode 38 were provided on the n-type GaN layer 32 and p-type GaN layer 36, respectively, using a known device formation technique.

The brightness of the device obtained was measured when light was emitted by passing a current of 20 mA in the forward direction between the n-electrode 37 and the p-electrode 38 of the device. The results obtained are shown in Table 1.

Also, the water concentration of the liquid phase ammonia in the charging container (at the initiation of test) is shown in Table 1 below.

Test Examples 2 to 7

GaN-type compound semiconductor devices were manufactured in the same manner as in Test Example 1 except that the water concentration of ammonia (at the initiation of test) used by filling it in a charging container was changed as shown in Table 1 below.

The light emission brightness of the thus-obtained GaN-type compound semiconductor devices were measured and the results are shown together in Table 1.

The water concentration of the liquid phase ammonia was determined by sampling and vaporizing the liquid phase ammonia in the charging container and measuring the water content in the gas obtained using FT-IR (MAGNA560, manufactured by NICOLET).

The water concentration of the liquid phase ammonia shown here is water content in terms of volume percent of part per million (vol ppm) in the gas obtained by sampling and vaporizing the liquid phase ammonia.

TABLE 1

|  | Water Concentration in Liquid Phase (vol ppm) | Brightness (cd) |
| --- | --- | --- |
| Test Example 1 | 1.0 | 0.1 |
| Test Example 2 | 0.8 | 0.5 |
| Test Example 3 | 0.5 | 1.5 |
| Test Example 4 | 0.4 | 2.1 |

TABLE 1-continued

|  | Water Concentration in Liquid Phase (vol ppm) | Brightness (cd) |
| --- | --- | --- |
| Test Example 5 | 0.2 | 2.6 |
| Test Example 6 | 0.1 | 2.8 |
| Test Example 7 | 0.01 | 3.0 |

It is seen from the results in Table 1 that devices manufactured by the method of using ammonia in which the liquid phase ammonia has a water concentration of 0.5 vol ppm or less, have excellent light emitting properties.

In particular, devices manufactured by the method of using ammonia in which the above-described water concentration is 0.4 vol ppm or less exhibit high brightness of 2 cd or more. Furthermore, devices manufactured using ammonia in which the above-described water concentration is 0.2 vol ppm or less have still more excellent light emitting properties.

As described in the foregoing, according to the present invention, a GaN-type compound semiconductor having excellent light emitting properties such as brightness can be obtained without fail and the production yield can be improved.

While the invention has been described in detail and with reference to specific embodiments thereof, it will be apparent to one skilled in the art that various changes and modifications can be made therein without departing from the spirit and scope thereof.

What is claimed is:

1. A method for manufacturing a GaN-type compound semiconductor light emitting device, comprising introducing ammonia in the gaseous state into a reaction chamber housing therein a substrate, and forming a layer comprising a GaN-type compound started from the ammonia on the substrate, wherein said ammonia is taken out in the gaseous state from a charging container, in a room temperature condition, a portion of ammonia in the charging container being in a liquid phase and another portion of ammonia in the charging container being in the gas phase, and a water concentration of said liquid phase ammonia in the charging container being controlled in the range between 0.01 and 0.5 vol ppm as determined by Fourier-transform infrared spectroscopy (FT-IF).

2. A method for manufacturing a GaN-type compound semiconductor light emitting device according to claim 1, wherein a water concentration of said liquid phase ammonia in the charging container is controlled in the range between 0.01 and 0.4 vol ppm as determined by Fourier-transform infrared spectroscopy (FT-IR).

3. A method for manufacturing a GaN-type compound semiconductor light emitting device according to claim 1, wherein a water concentration of said liquid phase ammonia in the charging container is controlled in the range between 0.01 and 0.2 vol ppm determined by Fourier-transform infrared spectroscopy (FT-IR).

* * * * *